United States Patent
Ichimura

(10) Patent No.: US 7,489,135 B2
(45) Date of Patent: Feb. 10, 2009

(54) ELECTRIC POTENTIAL MEASURING INSTRUMENT AND IMAGE FORMING APPARATUS

(75) Inventor: Yoshikatsu Ichimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 113 days.

(21) Appl. No.: 11/579,769

(22) PCT Filed: Jun. 7, 2005

(86) PCT No.: PCT/JP2005/010758
§ 371 (c)(1),
(2), (4) Date: Nov. 8, 2006

(87) PCT Pub. No.: WO2005/121819
PCT Pub. Date: Dec. 22, 2005

(65) Prior Publication Data
US 2007/0229086 A1 Oct. 4, 2007

(30) Foreign Application Priority Data
Jun. 8, 2004 (JP) ............................... 2004-169274

(51) Int. Cl.
*G01R 29/12* (2006.01)
(52) U.S. Cl. .................. 324/457; 324/72; 324/663; 324/458; 318/652; 399/73; 257/314
(58) Field of Classification Search ................. 324/457; 399/73
See application file for complete search history.

(56) References Cited

U.S. PATENT DOCUMENTS

| | | | |
|---|---|---|---|
| 4,030,347 A | 6/1977 | Norris et al. ................ 73/88.5 |
| 4,205,267 A * | 5/1980 | Williams ................... 324/458 |
| 4,370,616 A | 1/1983 | Williams |
| 4,605,946 A * | 8/1986 | Robinson, Jr. .............. 257/314 |
| 4,720,682 A | 1/1988 | Ikushima et al. ............ 324/458 |

(Continued)

FOREIGN PATENT DOCUMENTS

DE 27 15 831 10/1978

(Continued)

OTHER PUBLICATIONS

Riehl, P.S., "Microsystems for Electrostatic Sensing", Dissertation, 'Online!, Nov. 2002, pp. 1-8, 32-40, 79-84.

(Continued)

*Primary Examiner*—Timothy J Dole
*Assistant Examiner*—Benjamin M Baldridge
(74) *Attorney, Agent, or Firm*—Fitzpatrick, Cella, Harper & Scinto

(57) ABSTRACT

The electric potential measuring instrument comprises an electrode arranged on a semiconductor substrate at a position opposite to the object of measurement and a modulator for modulating the coupling capacitance between the object of measurement and the electrode. The electrode is the gate electrode of a field effect type transistor. The modulated electric current that flows between the source diffusion region and the drain diffusion region of the field effect type transistor is synchronously detected by a detection circuit with the modulation frequency of the modulator. The output signal that appears on the gate electrode of a field effect transistor can be measured with ease by changing the coupling capacitance between the electrode of an electric potential measuring instrument and an object of measurement.

8 Claims, 5 Drawing Sheets

U.S. PATENT DOCUMENTS

| | | | | |
|---|---|---|---|---|
| 5,212,451 | A | 5/1993 | Werner, Jr. | 324/458 |
| 5,323,115 | A * | 6/1994 | Werner, Jr. | 324/457 |
| 5,504,356 | A | 4/1996 | Takeuchi et al. | 257/254 |
| 6,160,569 | A | 12/2000 | Fujimori et al. | |
| 6,965,239 | B2 | 11/2005 | Yasuda et al. | 324/458 |
| 7,049,804 | B2 * | 5/2006 | Ichimura et al. | 324/457 |
| 7,149,442 | B2 | 12/2006 | Ushijima et al. | 399/48 |
| 7,212,007 | B2 | 5/2007 | Yasuda et al. | 324/458 |
| 7,242,882 | B2 | 7/2007 | Ichimura et al. | 399/48 |
| 2003/0057977 | A1 | 3/2003 | Werner, Jr. et al. | 324/754 |
| 2006/0186898 | A1 | 8/2006 | Ichimura et al. | 324/663 |
| 2006/0192565 | A1 | 8/2006 | Yasuda et al. | 324/458 |
| 2006/0267578 | A1 | 11/2006 | Ushijima et al. | 324/158.1 |
| 2007/0154231 | A1 | 7/2007 | Ichimura et al. | 399/73 |

FOREIGN PATENT DOCUMENTS

| | | |
|---|---|---|
| DE | 43 28 083 | 3/1994 |
| DE | 100 44 887 | 5/2001 |
| EP | 1 003 044 | 5/2000 |
| JP | 02-071166 | 3/1990 |
| JP | 04-025764 | 1/1992 |
| JP | 06-196721 | 7/1994 |
| JP | 06-196722 | 7/1994 |
| JP | 08-110361 | 4/1996 |

OTHER PUBLICATIONS

Hsu, C.H. et al., "Micromechanical electrostatic voltmeter", Transducers, San Francisco, Jun. 24-27, 1991, Proceedings of the International Conference on solid State Sensors and Actuators, New York, IEEE, US, vol. Conf. 6, Jun. 24, 1991, pp. 659-662.

Parak W J et al: "The field-effect-addressable potentiometric sensor/stimulator (FAPS)—a new concept for a surface potential sensor and stimulator with spatial resolution" Sensors and Actuators B, Elsevier Sequoia S.A., Lausanne, CH, vol. 58, No. 1-3, Sep. 21, 1999, pp. 497-504, XP004253054 ISSN: 0925-4005 figure 2.

PCT International Search Report in corresponding International Application No. PCT/JP2005/010758, dated Oct. 27, 2005.

Written Opinion of the International Searching Authority in corresponding International Application No. PCT/JP2005/010758, dated Oct. 27, 2005.

Official Action in Chinese Application No. 200580018541.6, dated Feb. 1, 2008.

* cited by examiner

ELECTRIC POTENTIAL MEASURING INSTRUMENT AND IMAGE FORMING APPARATUS

TECHNICAL FIELD

This invention relates to an electric potential measuring instrument (electric potential sensor) for measuring the electric potential of an object of measurement without contacting the latter and also to an image forming apparatus that can be used as a copying machine or a printer and comprises such an electric potential measuring instrument.

BACKGROUND ART

Known image forming apparatus comprising a photosensitive drum and adapted to form an image by electronic photography are required to keep the photosensitive drum electrified so as to uniformly show a certain electric potential. For this purpose, an electric potential measuring instrument is used to measure the electric potential of the electrified photosensitive drum and a feedback control system is operated to keep the photosensitive drum electrified so as to uniformly show a predetermined electric potential, utilizing the reading of the instrument.

Now, the operation of a known electric potential measuring instrument will be discussed below. A technique of mechanically modulating an electric field and inducing an alternating current to electrodes is often used for non-contact type electric potential measuring instruments (mechanical AC field induction type). With this technique, the electric potential of the surface of the object of measurement is a function of the magnitude of the electric current i that is taken out from a detection electrode contained in the electric potential measuring instrument as expressed by formula (1) below;

$$i = dQ/dt = d(C \cdot V)/dt \tag{1}$$

where Q is the quantity of the electric charge that appears on the detection electrode, C is the coupling capacitance between the detection electrode and the object of measurement and V is the surface voltage of the object of the measurement.

The capacitance C is expressed by formula (2) below;

$$C = A \cdot S/x \tag{2}$$

where A is a constant of proportion, S is the surface area of the detection electrode and x is the distance between the detection electrode and the object of measurement.

The quantity of the electric charge that appears on the detection electrode is very small and can easily be influenced by the noise found around it. For this reason, a synchronous detection method is often used to measure the very small quantity of charge Q. In other words, a necessary signal is obtained by periodically modulating the magnitude of the capacitance C between the detection electrode and the object of measurement by an appropriate means and detecting same frequency components from the observed signal.

In the case of the above described typical method, a fork-shaped shutter is inserted between the object of measurement and the detection electrode and periodically moved in a direction running in parallel with the surface of the object of measurement to partly block the lines of electric force arriving at the detection electrode from the object of measurement in a mode of periodically modulating them so as to effectively change the area S of the detection electrode and consequently modulate the electrostatic capacitance C between the object of measurement and the detection electrode (U.S. Pat. No. 4,720,682).

On the other hand, there is an increasing demand for small photosensitive drums to be used in electrophotographic image forming apparatus and related components are required to be arranged highly densely around the drum. At the same time, electric potential measuring instruments are also required to be downsized and made thin. However, in the case of above described currently available mechanical AC field induction type sensors, the internal space of the sensor structure is mostly occupied by the drive mechanism for driving the fork-shaped shutter, or the fork-shaped oscillator to oscillate, and some other assembly components. Therefore, the drive mechanism needs to be indispensably downsized in order to downsize the electric potential measuring instrument.

In view of the above identified technical circumstances, the magnitude of the electric current that is taken out from a mechanical AC field induction type electric potential sensor is given by formula (3) below on the basis of the above formulas (1) and (2).

$$i = d(A \cdot V \cdot S/x)/dt \tag{3}$$

Therefore, as the electric potential sensor is downsized, the surface area S of the electrode is reduced to in turn reduce the output current i of the sensor. Such a sensor is disadvantageous in terms of accuracy of measurement because it is highly apt to be influenced by external noise.

DISCLOSURE OF THE INVENTION

In an aspect of the present invention, the above object is achieved by providing an electric potential measuring instrument comprising an electrode arranged on a semiconductor substrate at a position opposite to an object of measurement and a modulation means for modulating the coupling capacitance between the object of measurement and the electrode, wherein the electrode is the gate electrode of an field effect type transistor.

In another aspect of the present invention, there is provided an image forming apparatus comprising an electric potential measuring instrument according to the invention and an image forming means, wherein the surface of the electric potential measuring instrument equipped with the gate electrode is arranged opposite to the surface to be measured for electric potential of the image forming means and the image forming means controls the image forming operation thereof by using the outcome of the signal detection of the electric potential measuring instrument. In this image forming apparatus, too, the characteristic of the electric potential measuring instrument is used efficiently.

Thus, according to the invention, the operation of observing the output signal that appears on the gate electrode is facilitated by changing the coupling capacitance between the electrode and the object of measurement.

BEST MODE FOR CARRYING OUT THE INVENTION

In an electric potential measuring instrument comprising an electrode which is the gate electrode of a field effect type transistor arranged on a semiconductor substrate at a position opposite to an object of measurement and a modulation means for modulating the coupling capacitance between the object of measurement and said electrode, the modulation means may typically be a chopper section arranged on a semiconductor substrate and adapted to partly block the lines of electric force emitted to the electrode with a constant cycle and a drive mechanism thereof or a swinging mechanism adapted to periodically modulate the distance between the object of measurement and the electrode. Since the electrode is the gate electrode of the field effect type transistor formed on the semiconductor substrate, it is possible to amplify and detect the output signal that appears at the gate electrode by means of the field effect type transistor structure and by changing the coupling capacitance between the electrode and the object of measurement. Thus, it is possible to prepare a high performance electric potential measuring instrument. The signal is synchronously detected by means of a detection circuit with the modulation frequency of the modulation means.

According to the invention, it is also possible to realize a highly sensitive electric potential measuring instrument and an image forming apparatus comprising such an electric potential measuring instrument by arranging a plurality of combinations of a field effect type transistor and a chopper as described above on the semiconductor substrate where the transistors are formed. Additionally, in an image forming apparatus according to the invention, the image forming means may have the function of a copying machine, a printing machine or a fax machine. The image forming means may have a photosensitive drum that revolves around a predetermined axis and operate to measure the electric potential of the electric charge on the surface of the photosensitive drum by means of the electric potential measuring instrument.

Now, the present invention will be described by referring to the accompanying drawings that illustrate preferred embodiments of the invention.

First Embodiment

Figure 1:
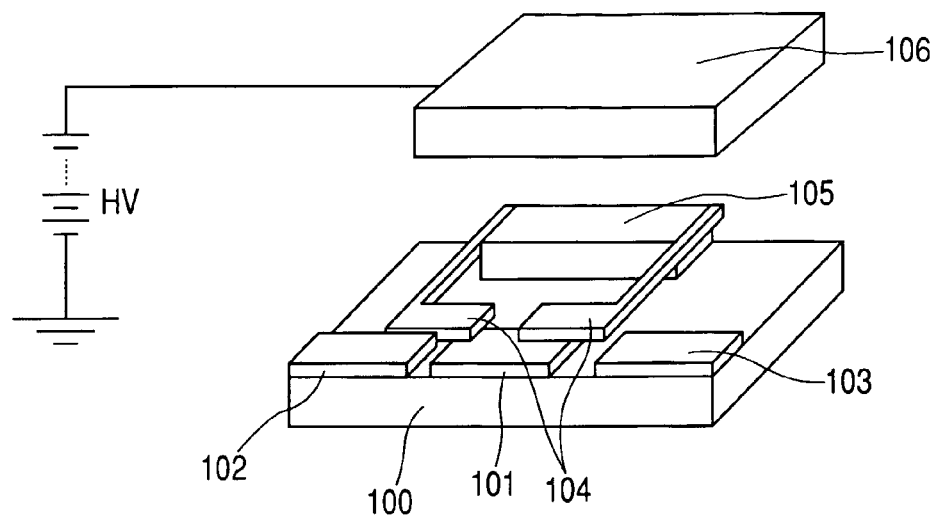
FIG. 1 is a schematic perspective view of the first embodiment of the present invention, which is an electric potential sensor, showing the positional relationship between the sensor and the object of measurement.

The first embodiment of the invention will be described by referring to FIGS. 1 through 3. FIG. 1 shows the overall configuration of this embodiment of electric potential sensor. Referring to FIG. 1, a signal detection electrode 101, which is a gate electrode, a source electrode 102 and a drain electrode 103 are formed on the surface of a plate-like semiconductor substrate 100 typically made of silicon (Si). An object of measurement 106 is arranged above and vis-à-vis the signal detection electrode 101 and a chopper 104 that is driven to oscillate periodically and a drive mechanism 105 for driving the chopper to oscillate are arranged on the substrate 100 and between the detection electrode 101 and the object of measurement 106.

Figure 2:
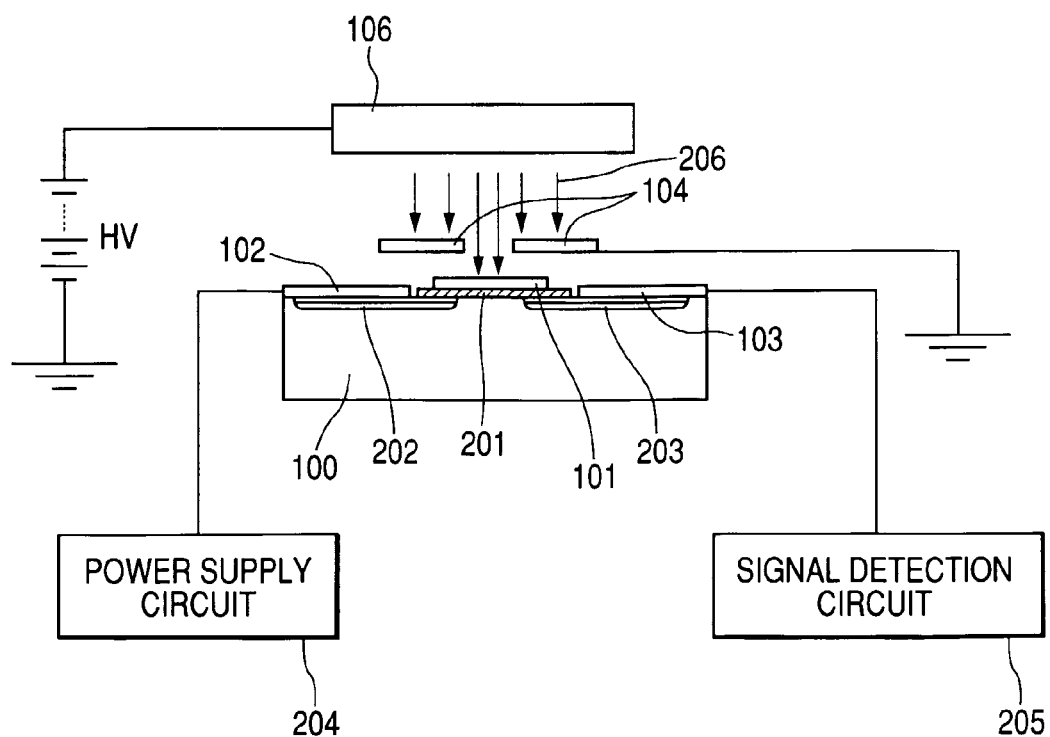
FIG. 2 is a schematic cross sectional view of the first embodiment of the invention, showing the inside of the semiconductor substrate.

FIG. 2 is a schematic cross sectional view of the electric potential sensor of the first embodiment, showing the structure of the substrate 100 and its surroundings in detail when the chopper 104 of the electric potential sensor is in a neutral state (where the two movable pieces of the chopper are not displaced and the front ends thereof are separated from each other by an appropriate gap). An impurity substance having a conductivity type opposite to that of the substrate 100 is implanted in the source diffusion region 202 and the drain diffusion region 203 that are formed on the substrate 100. The detection electrode 101 is formed on an insulating film 201 that is formed on the semiconductor substrate 100 and between the source electrode 102 and the drain electrode 103. A power supply circuit 204 and a signal detection circuit 205 are connected respectively to the source electrode 102 and the drain electrode 103.

As a voltage is applied to the object of measurement 106 in the state of FIG. 2, lines of electric force 206 are emitted from the object of measurement 106 toward the detection electrode 101. Although not shown, an appropriate cover is arranged above the source electrode 102 and the drain electrode 103 to cover the electrodes and protect them against the influence of lines of electric force emitted from the object of measurement 106.

In this state, the lines of electric force 206 partly arrive at the detection electrode 101 by way of the gap formed by the chopper 104 (which is grounded). The lines of electric force induce an electric charge on the detection electrode 101. At this time, the electric charge that is produced on the detection electrode 101 changes as a function of the electric potential of the object of measurement 106. The thickness of the inversion layer that is formed in a surface area of the semiconductor substrate 100 located right under the insulating film 201 and between the source diffusion region 202 and the drain diffusion region 203 is changed by the electric charge on the detection electrode 101. The amount of the change in the thickness of the inversion layer depends on the electric charge on the detection electrode 101.

As a voltage is applied between the source electrode 102 and the drain electrode 103, electric current flows between the source and the drain by way of the inversion layer. The intensity of the electric current is expressed as a function of the thickness of the inversion layer. Therefore, the electric current that flows between the source and the drain is expressed as a function of the electric potential that is applied to the object of measurement of electric potential 106 so that it is possible to detect the electric potential applied to the object 106 by detecting the electric current by means of the detection circuit 205.

Figure 3:
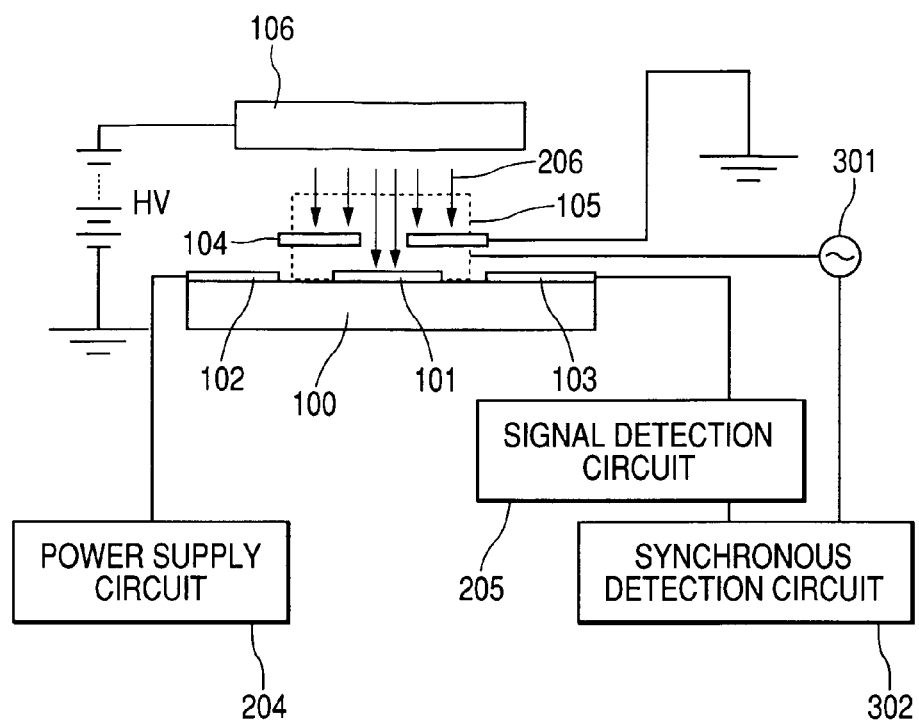
FIG. 3 is a schematic illustration of the positional relationship between the related components and the object of measurement when the chopper (shutter) is driven to open and close in the first embodiment of the invention.
Figure 4A:
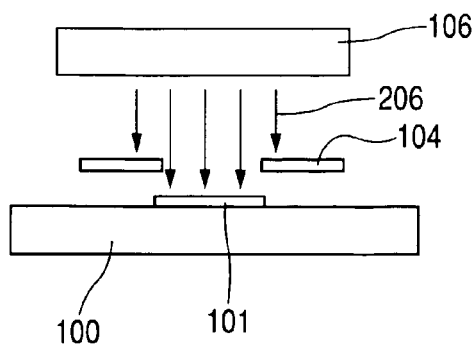
FIGS. 4A and 4B are schematic cross sectional views of the first embodiment of the invention, showing a state where the chopper (shutter) is fully opened and a state where the chopper (shutter) is fully closed.
Figure 4B:
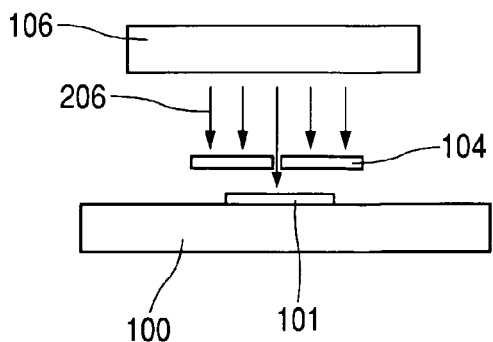

FIGS. 3, 4A and 4B are schematic cross sectional views of the electric potential sensor of this embodiment, illustrating the principle of operation of the sensor when the two movable pieces of the chopper 104 shows respective phases that are opposite to each other and oscillating laterally in the drawings. FIG. 3 illustrates the chopper 104 in a stationary neutral state, or passing through the position same as the one illustrated in FIG. 2, while it is being driven to oscillate. FIG. 4A illustrates the chopper 104 when it is fully opened and FIG. 4B illustrates the chopper 104 when it is fully closed. Note that FIGS. 3, 4A and 4B do not show the insulating film 201 and some other components for the purpose of easy viewing.

The chopper 104 is driven to oscillate by AC power source 301 by way of the chopper drive mechanism 105 at a frequency same as that of the drive signal supplied to the chopper drive mechanism 105. The AC power source 301 supplies a signal of a frequency same as that of chopper drive signal to synchronous detection circuit 302 as reference signal. As the front ends of the two movable pieces of the chopper 104 are opened and closed periodically, the amount of lines of electric force 206 that can get to the detection electrode 101 from the object of measurement 106 is modulated periodically. As a result, the electric charge that is induced on the detection electrode 101 and the electric current flowing between the source electrode 102 and the drain electrode 103 are also modulated. Thus, it is possible to detect the electric current component having a frequency same as that of the AC power source 301 and whose intensity corresponds to the electric potential of the object of measurement 106 by synchronously detecting the electric current at the synchronous detection circuit 302 by way of the detection circuit 205. The electric current component can be detected relatively highly sensitively and highly accurately because of synchronous detection.

Meanwhile, when the source diffusion region 202, the drain diffusion region 203 and the region located between these two regions and right under the detection electrode 101 shows the structure of a depression type field effect transistor, the electric current that flows between the source electrode and the drain electrode is proportional to the electric charge induced on the detection electrode 101. In other words, the electric potential sensor can be so configured as to detect an electric current that is proportional to the electric potential of the object of measurement 106. Then, the detection circuit can be made to have a relatively simple configuration.

Thus, it is possible to realize a relatively compact mechanism AC field induction type electric potential measuring instrument at low cost when the detection electrode and part of the mechanical chopper are integrally formed on a semiconductor substrate along with the upstream amplifier circuit section of a field effect type transistor, which is conventionally a separate part.

Second Embodiment

Now, the second embodiment of the present invention will be described by referring to FIGS. 5 and 6. This second embodiment is characterized in that a plurality of field effect type transistors and a plurality of choppers for modulating lines of electric force are formed on a same substrate and each of the field effect type transistors and each of the choppers have respective configurations same as those of their counterparts of the first embodiment.

A technique for improving the detection sensitivity of an electric potential sensor is to increase the surface area of the detection electrode. However, as the surface area of the detection electrode is increased, the chopper for modulating lines of electric force also needs to be made large. Then, there arises problems such as a high power consumption rate and a low drive frequency. The detection sensitivity of an electric potential sensor can be improved by arranging a large number of small detection electrodes so as to increase the total surface area of the detection electrodes without using a detection electrode having a large surface area. The size of the chopper can also be reduced by providing each of the divided small detection electrodes with a compact chopper to consequently prevent a high power consumption rate and a low drive frequency.

However, if a plurality of choppers, each of which is identical with the chopper of the first embodiment, are arranged along with a plurality of drive mechanisms, each of which is also identical with the drive mechanism of the first embodiment, a highly complex control mechanism will be required to control all the choppers so as to make them operate identically and simultaneously. Thus, a single shutter having a large number of open windows is used in this embodiment in place of arranging a plurality choppers.

Figure 5:
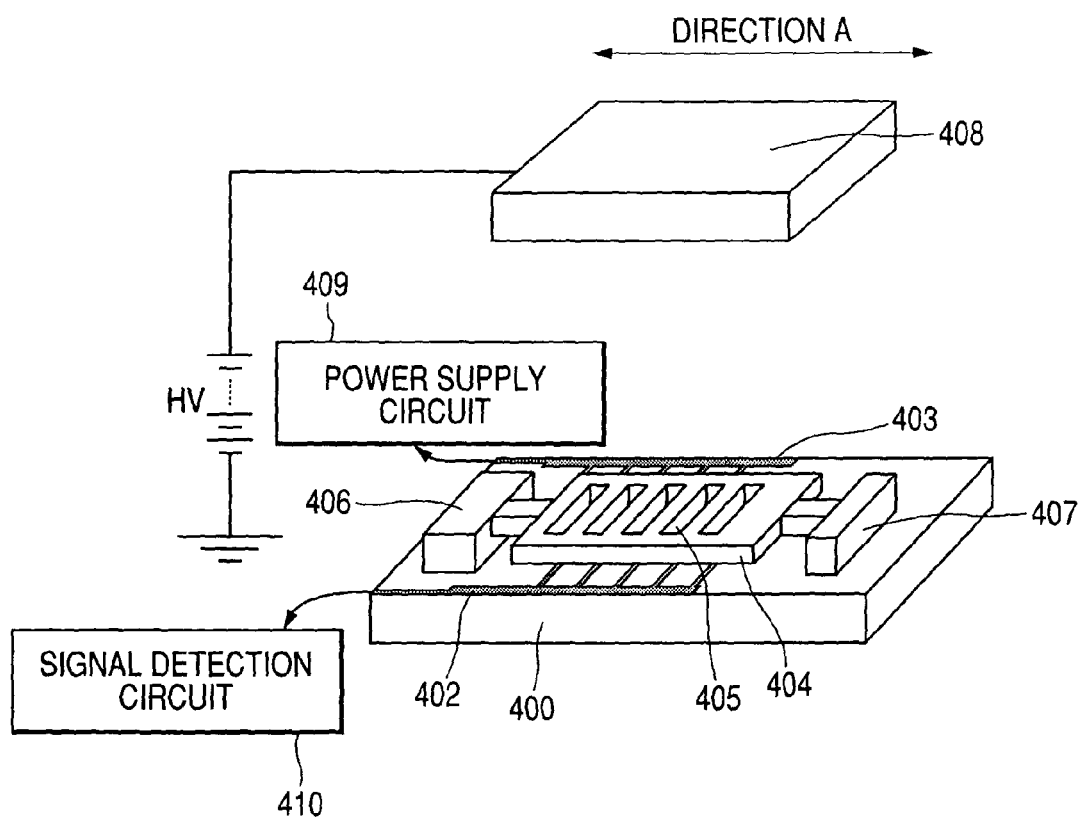
FIG. 5 is a schematic perspective view of the second embodiment of the present invention, which is an electric potential sensor, showing the positional relationship between the sensor and the object of measurement.

FIG. 5 shows the overall configuration of the second embodiment of electric potential sensor. Referring to FIG. 5, a shutter structure 404 having a plurality of cyclically arranged windows 405 is arranged on the surface of a plate-like semiconductor substrate 400 located vis-à-vis the object of measurement 408. The shutter structure 404 is fitted to a shutter drive mechanism 406 and a support body 407 and a gap is provided between the shutter structure 404 and the substrate 400. The shutter structure 404 is formed and arranged in such a way it can reciprocate along straight line A that connects the shutter drive mechanism 406 and the support body 407.

A plurality of combinations of a detection electrode, a source electrode and a drain electrode, or a plurality field effect type transistors, are arranged in the surface areas of the substrate 400 located right below the respective windows 405 of the shutter structure 404. The source electrode of each of the transistors is connected to a power supply circuit 409 by way of a source electrode connecting wire 403, while the drain electrode of each of the transistors is connected to a signal detection circuit 410 by way of a drain electrode connecting wire 402.

Figure 6:
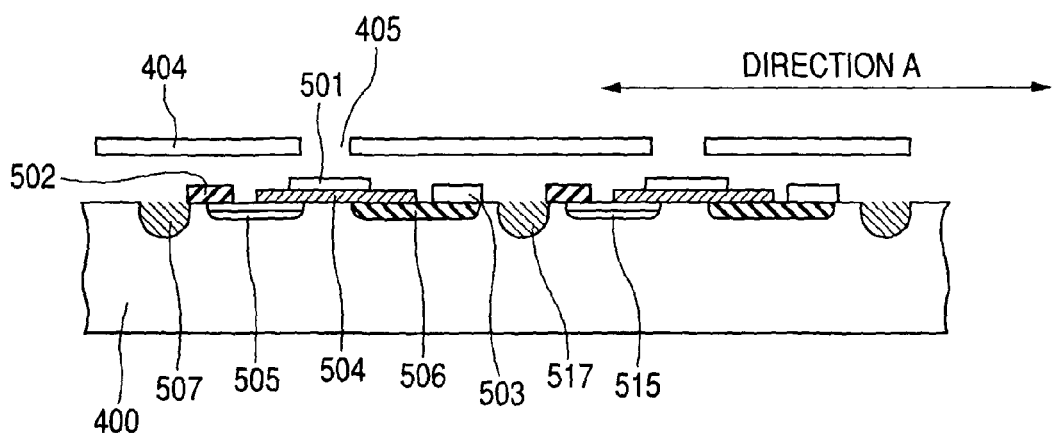
FIG. 6 is a schematic cross sectional view of the second embodiment of the invention, showing the inside of the semiconductor substrate.

FIG. 6 is a detailed schematic cross sectional view of part of the second embodiment located close to some of the windows 405 of the shutter structure 404 and the related detection electrodes. In FIG. 6, one of the detection electrodes 501 is arranged on the semiconductor substrate 400 by way of an insulating layer 504 so as to be located right below the corresponding one of the windows 405 of the shutter structure 404. The positional relationship of the source electrode 502, the source diffusion region 505, the drain electrode 503, the drain diffusion region 506, the detection electrode 501 and the insulating layer 504 is same as that of the comparable structure of first embodiment described above by referring to FIG. 2. The same and identical structures of the second embodiment are arranged side by side on the substrate 400 at a pitch same as that of the windows 405 formed in the shutter structure 404. In FIG. 6, a high resistance region 517 is arranged between the source diffusion region 515 and the drain diffusion region 506 and another high resistance region 507 is arranged between the source diffusion region 505 and the corresponding drain diffusion region.

The number of lines of electric force emitted from the object of measurement 408 and arriving at the detection electrode 501 can be modulated by periodically driving the shutter structure 404 to oscillate in the direction of A in FIG. 6 so as to periodically move the window 405 of the shutter structure 404 above the detection electrode 501.

A voltage is applied to the source electrode 502 from the power supply circuit 409 by way of the source electrode connecting wire 403, as shown in FIG. 5. Thus, as the electric charge that is induced on the detection electrode 501 is modulated by the movement of the shutter structure 404, the size of the inversion region in the semiconductor substrate 400 located right under the insulating layer 504 is consequently modulated. Then, the electric current flowing between the source diffusion region 505 and the drain diffusion region 506 is also modulated. Thus, like the first embodiment of the present invention, the second embodiment can highly sensitively detect the electric potential of the object of measurement 408 by synchronously detecting the electric current by means of the detection circuit 410 by way of the drain electrode 503 and the drain electrode connecting wire 402 at the oscillation frequency of the shutter structure 404.

Since a plurality of field effect type transistors are arranged side by side on the surface of a semiconductor substrate in the second embodiment, mutual interference can arise among the source diffusion regions and the drain diffusion regions of different transistors. For instance, electric current can flow from the source diffusion region 515 to the drain diffusion region 506 of the adjacently located transistor structure. However, such a phenomenon can be prevented from appearing by arranging high resistance regions 507, 517, etc. to separate adjacently located transistors and hence it does not give rise to any problem in this embodiment.

A so-called MIS-field effect type transistor (FET) structure realized by inserting an insulating body between the detection electrode and the semiconductor substrate is used in the first and second embodiments in the above description. However, for the purpose of the present invention, the relationship between the detection electrode and the semiconductor substrate is not limited to the MIS structure. For instance, a MOS-FET structure where the insulating layer is made of oxide or a MES-FET structure having no insulating layer may alternatively be used for the purpose of the present invention without any problem in principle.

Third Embodiment

Figure 7:
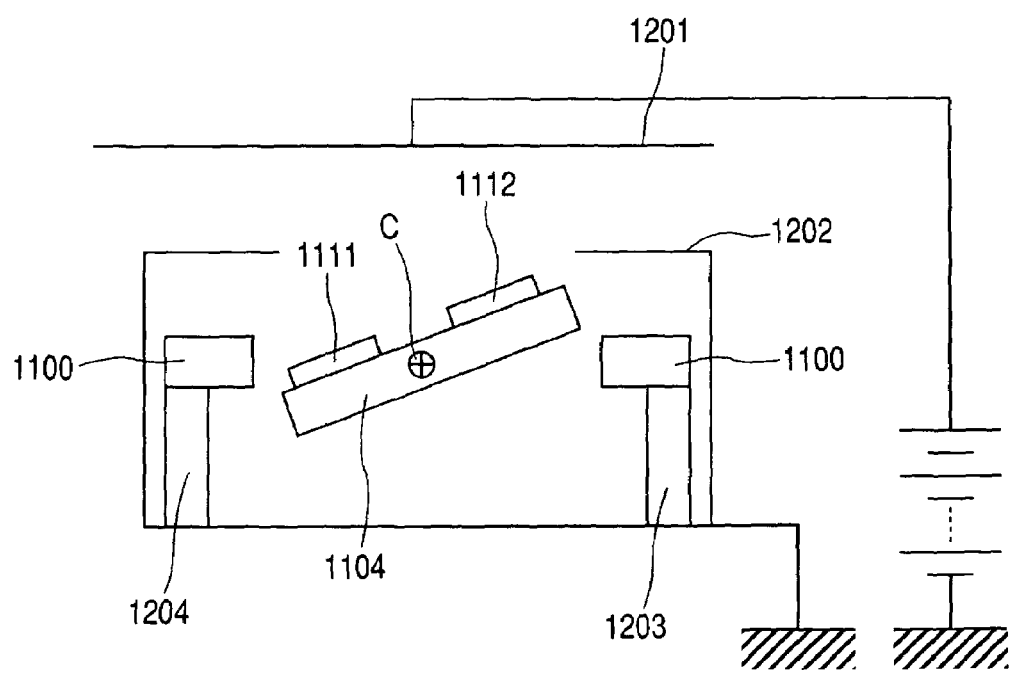
FIG. 7 is a schematic illustration of the third embodiment of the present invention, which is an electric potential sensor, showing the positional relationship between the sensor and the object of measurement.

The number of lines of electric force that arrive at the detection electrode, which is a gate electrode of a transistor, is modulated in each of the above-described embodiments (so as to change the S in the above formula (2)). However, the coupling capacitance can be made to change by modulating the distance x between the object of measurement and the detection electrode as may be seen from the above formula (2). Such a technique is used in the third embodiment of the invention. FIG. 7 is a schematic illustration of the third embodiment of the present invention, which is an electric potential sensor, showing the configuration thereof.

FIG. 7 shows how the electric potential sensor is arranged relative to surface 1201, which is the object of measurement. In FIG. 7, numeral 1202 denotes a case for containing the electric potential sensor that covers a top portion of a swinging body 1104 except the parts of the detection electrodes. The case is made of an electrically conductive material and grounded. A support substrate 1100 that supports the swinging body 1104 is rigidly fitted to the case 1202 by means of appropriate jigs 1203, 1204. Due to the provision of the case 1202, lines of electric force get to the detection electrodes 1111, 1112 only from the part of the surface 1201 of the object of measurement that substantially squarely faces the swinging body 1104 so that it is possible to suppress the noise component and accurately measure the electric potential. An aperture is formed in a central part of the support substrate 1100 and the swinging body 1104 is supported by means of a pair of torsion springs arranged respectively in front of and behind the plate-like swinging body 1104 in a direction perpendicular relative to FIG. 7 in the central hollow part of the aperture so as to allow the swinging body 1104 to swing around central axial line C shown in FIG. 7.

Additionally, two plate-like detection electrodes (gate electrodes) 1111, 1112 having a same and identical profile are arranged for axial symmetry relative to the central axial line C on the top surface of the swinging body 1104 by way of an insulating film (not shown). A set of a source electrode, a source diffusion region and a source electrode connecting wire (not shown) and a set of a drain electrode, a drain diffusion region and a drain electrode connecting wire (not shown) are arranged respectively in front of and behind each of the detection electrode in FIG. 7. The configuration of such a field effect type transistor is already described above for the preceding embodiments. As the swinging body 1104 is driven to swing around the central axial line C, the detection electrodes (gate electrodes) 1111, 1112 arranged thereon are driven to move toward and away from the surface 1201 of the object of measurement in opposite phases to make it possible to differentially amplify the drain current as will be described in greater detail hereinafter. Each of the drain electrodes is connected to a take-out electrode formed on the support substrate 1100 and the drain electrodes are connected, for instance, respectively to the inverted input contact and the non-inverted input contact of a differential amplifier arranged outside the support substrate 1100. With this arrangement, the drain currents are differentially amplified and synchronously detected by means of a detection circuit as in the case of the preceding embodiments. Of course, it is also possible to arrange a single detection electrode on the top surface of the swinging body 1104 (in other words, remove one of the detection electrodes of FIG. 7) and detect the drain current without differential amplification as in the case of the preceding embodiments.

The swinging body 1104 is driven to swing periodically around the central axial line C of the torsion springs that operates as center of revolution to periodically change the distance between the detection electrodes on the swing body 1104 and the surface 1201 of the object of measurement after adding an appropriate swinging body drive mechanism to the electric potential sensor and appropriately selecting the profile and the material of the swing body 1104 and those of the torsion springs. Then, it is possible to detect the electric potential of the object of measurement 1201 as in the case of the preceding embodiments by modulating the electric current flowing between the source diffusion region and the drain diffusion region of each transistor and synchronously detecting the electric current by means of the detection circuit with the swinging frequency of the swinging body 1104. The swinging body drive mechanism for driving the swinging body 1104 to swing is typically formed by means of a magnet arranged on the rear surface of the swing body and an external coil that generates a magnetic field when an alternating current is made to flow through it. Otherwise, this embodiment is identical with the first embodiment.

Fourth Embodiment

Figure 8:
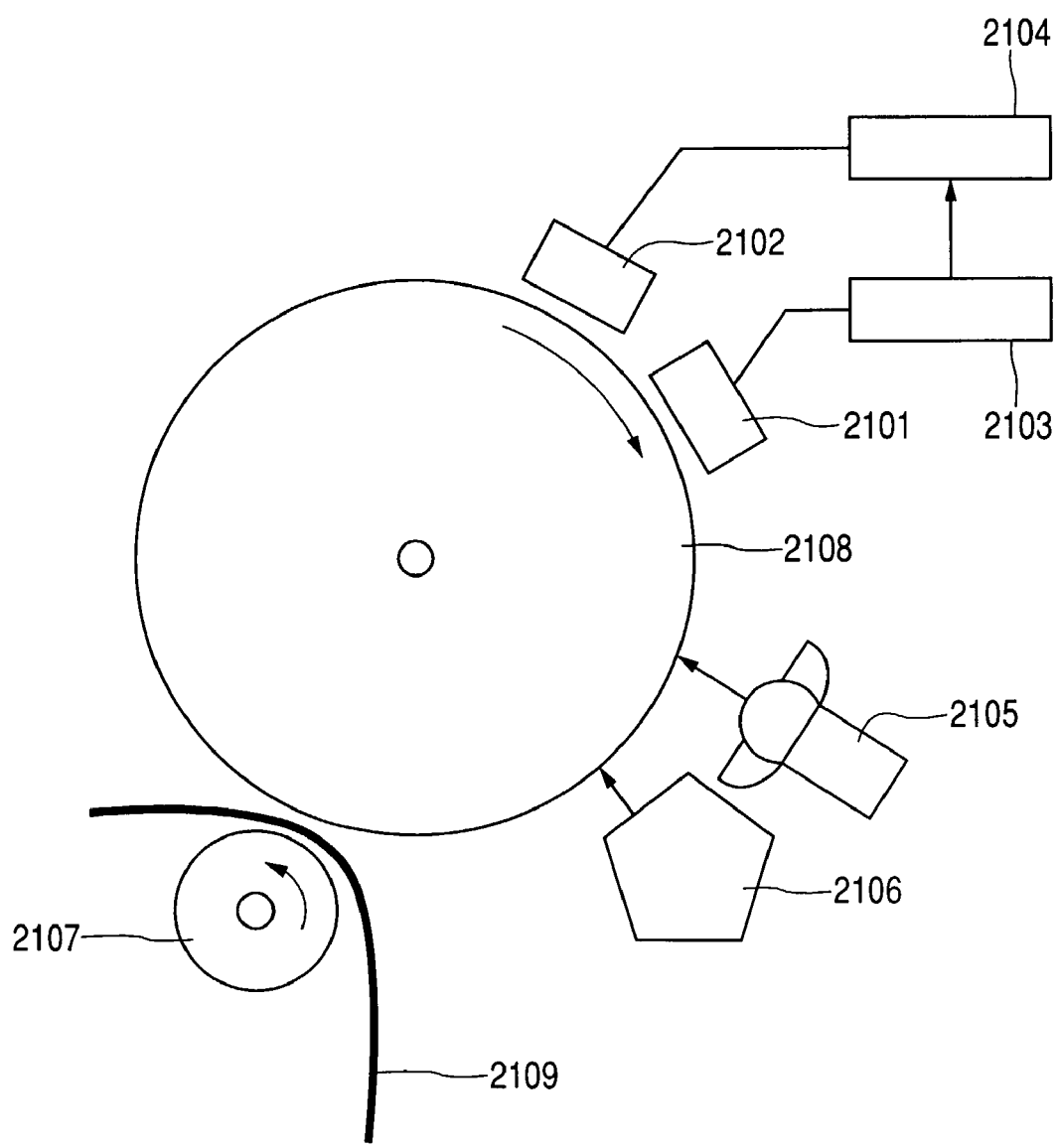
FIG. 8 is a schematic illustration of the fourth embodiment of the present invention, which is an image forming apparatus.

FIG. 8 is a schematic illustration of the fourth embodiment of the present invention, which is an image forming apparatus. More specifically, FIG. 8 schematically illustrates the photosensitive drum of an electrophotographic developing apparatus comprising an electric potential sensor according to the invention and its vicinity. An electrifying unit 2102, an electric potential sensor 2101, an exposing unit 2105 and a toner supplying unit 2106 are arranged around a photosensitive drum 2108. A latent image is obtained by electrifying the surface of the drum 2108 by means of the electrifying unit 2102 and exposing the surface of the photosensitive drum 2108 by means of the exposing unit 2105. Then, toner is made to adhere to the latent image by means of the toner supplying unit 2106. Subsequently, the toner image is transferred onto a transfer member 2109 that is pinched between a transfer member feed roller 2107 and the photosensitive drum 2108 and then the toner image on the transfer member is made to rigidly adhere to the latter. An image is formed by way of the above-described step.

In the above-described arrangement, the electrified state of the drum 2108 is measured by means of the highly sensitive electric potential sensor 2101 according to the invention and the signal from the electric potential sensor 2101 is processed by means of a signal processing unit 2103 and fed back to high voltage generator 2104 so as to control the electrifying unit 2102. As a result, the photosensitive drum 2108 is stably electrified and image forming operations are conducted stably to produce high quality images.

This application claims priority from Japanese Patent Application No. 2004-169274 filed on Jun. 8, 2004, which is hereby incorporated by reference herein.

The invention claimed is:

1. An electric potential measuring instrument comprising a semiconductor substrate arranged at a position opposite to an object of measurement, an electrode arranged on said semiconductor substrate, and modulation means for modulating the coupling capacitance between the object of measurement and said electrode, wherein said electrode is the gate electrode of a field effect type transistor formed on said semiconductor substrate.

2. The instrument according to claim 1, wherein said modulation means includes a chopper adapted to partly block the lines of electric force emitted from the object of measurement to said electrode with a constant cycle and a drive mechanism thereof.

3. The instrument according to claim 2, wherein said chopper and the drive mechanism thereof are arranged on said semiconductor substrate.

4. The instrument according to claim 1, wherein a plurality of field effect type transistors and a plurality of modulation means are arranged on said semiconductor substrate.

5. The instrument according to claim 1, wherein said modulation means is a swinging mechanism adapted to periodically modulate the distance between the object of measurement and said electrode.

6. The instrument according to claim 1, wherein a plurality of electrodes are arranged on said semiconductor substrate.

7. The instrument according to claim 1, wherein the modulated electric current flowing between the source diffusion region and the drain diffusion region of said field effect type transistor is synchronously detected by means of a detection circuit with the modulation frequency of said modulation means.

8. An image forming apparatus comprising an electric potential measuring instrument according to claim 1 and image forming means, wherein the surface of the electric potential measuring instrument carrying the gate electrode is arranged at a position opposite to the surface of said image forming means that is the object of measurement and the image forming means controls the image forming operation of the apparatus by means of the outcome of signal detection of the electric potential measuring instrument.

* * * * *